United States Patent

Togawa et al.

[11] Patent Number: 6,042,455
[45] Date of Patent: Mar. 28, 2000

[54] POLISHING APPARATUS

[75] Inventors: Tetsuji Togawa, Chigasaki; Kuniaki Yamaguchi, Yokohama; Nobuyuki Takada, Fujisawa, all of Japan

[73] Assignee: Ebara Corporation, Tokyo, Japan

[21] Appl. No.: 09/208,987

[22] Filed: Dec. 11, 1998

[30] Foreign Application Priority Data

Dec. 11, 1997 [JP] Japan ................................ 9-362011

[51] Int. Cl.⁷ .................................................. B24B 49/00
[52] U.S. Cl. .................................. 451/8; 451/45; 451/59; 451/63; 454/187; 454/195
[58] Field of Search ................................ 451/45, 59, 63, 451/456, 8, 451; 454/187, 195

[56] References Cited

U.S. PATENT DOCUMENTS

| | | | |
|---|---|---|---|
| 5,653,623 | 8/1997 | Kimura et al. | 451/72 |
| 5,655,954 | 8/1997 | Oishi et al. | 451/67 |
| 5,664,995 | 9/1997 | O'Keefe | 454/58 |
| 5,679,059 | 10/1997 | Nishi et al. | 451/41 |

*Primary Examiner*—David A. Scherbel
*Assistant Examiner*—Shantese McDonald
*Attorney, Agent, or Firm*—Wenderoth, Lind & Ponack, L.L.P.

[57] ABSTRACT

A polishing apparatus is used for polishing a workpiece such as a semiconductor wafer to a flat mirror finish. The polishing apparatus includes an enclosing structure having an outer wall and at least one door, a polishing section enclosed by the enclosing structure for polishing a surface of a workpiece by holding the workpiece and pressing the workpiece against a polishing surface of a turntable, a sensor for detecting an opening or closing of the door, and an exhaust system for exhausting ambient air from an interior of the enclosing structure. The polishing apparatus further includes an adjusting mechanism for adjusting an amount of air which is exhausted from the interior of the enclosing structure. The amount of air exhausted from the interior of the enclosing structure is reduced by the adjusting mechanism when the door is closed, and the amount of air exhausted from the interior of the enclosing structure is increased by the adjusting mechanism when the door is opened.

19 Claims, 6 Drawing Sheets

POLISHING APPARATUS

BACKGROUND OF THE INVENTION

1. Field of the Invention

The present invention relates to a polishing apparatus for polishing a workpiece such as a semiconductor wafer to a flat mirror finish, and more particularly to a polishing apparatus having an exhaust system for exhausting an interior of the polishing apparatus. The polishing apparatus may include a polishing section for polishing a surface of the workpiece and a cleaning section for cleaning the workpiece which has been polished.

2. Description of the Related Art

Recent rapid progress in semiconductor device integration demands smaller and smaller wiring patterns or interconnections and also narrower spaces between interconnections which connect active areas. One of the processes available for forming such interconnection is photolithography. Though the photolithographic process can form interconnections that are at most 0.5 μm wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus, and such a process is called Chemical Mechanical polishing.

Conventionally, a polishing apparatus has a turntable and a top ring which rotate at respective individual speeds. A polishing cloth is attached to the upper surface of the turntable. A semiconductor wafer to be polished is placed on the polishing cloth and clamped between the top ring and the turntable. An abrasive liquid containing abrasive grains (or material) is supplied onto the polishing cloth and retained on the polishing cloth. During operation, the top ring exerts a certain pressure on the turntable, and the surface of the semiconductor wafer held against the polishing cloth is therefore polished by a combination of chemical polishing and mechanical polishing to a flat mirror finish while the top ring and the turntable are rotated.

There has been proposed such a polishing apparatus which incorporates a polishing section for polishing semiconductor wafers and a cleaning section for cleaning the polished semiconductor wafer in an enclosing structure such as a housing. To be more specific, the polishing apparatus comprises an enclosing structure, a polishing section for polishing semiconductor wafers, a cleaning section for cleaning the semiconductor wafers which are to be polished or have been polished, and a transfer robot (or robots) for transferring the semiconductor wafers which are to be polished or have been polished.

When a wafer cassette containing a plurality of semiconductor wafers to be polished is set in a predetermined position in the polishing apparatus, a hand of the transfer robot takes out a semiconductor wafer from the wafer cassette and transfers the semiconductor wafer to a transfer unit in the polishing section. The semiconductor wafer is then transferred from the transfer unit to a top ring, and is held by the top ring under vacuum. The top ring is moved above a turntable, and the rotating top ring presses the semiconductor wafer against a polishing surface of the rotating turntable, whereby the semiconductor wafer is polished to a flat mirror finish while an abrasive liquid is supplied to the polishing surface of the turntable.

After the semiconductor wafer is polished, it is returned to the transfer unit, and then transferred to the cleaning section by the hand of the transfer robot. In the cleaning section, the polished semiconductor wafer is cleaned to cause abrasive material adhering to a surface of the semiconductor wafer to be removed, and thus a cleaned surface of the semiconductor wafer is obtained. After the semiconductor wafer is cleaned by the cleaning section, it is transferred to a spinning drier by the transfer robot, and then spin-dried in the spinning drier. The cleaned and dried semiconductor wafer is returned to the wafer cassette by the transfer robot.

In the polishing section, during polishing, mist of the abrasive liquid is scattered around, and therefore the mist of the abrasive liquid or ground-off particles generated in the polishing section are exhausted from the interior of the polishing section to the exterior of a clean room in which the polishing apparatus is installed. Similarly, in the cleaning section, since organic solvent or acid cleaning solution is evaporated, ambient air in the cleaning section is exhausted from the interior of the cleaning section to the exterior of the clean room so that ambient air in the polishing apparatus is prevented from flowing into the clean room having a clean ambient air environment.

In the polishing apparatus having the above structure, a door is provided for carrying in or carrying out the wafer cassette, monitoring an operational condition, or performing maintenance of various devices. It is therefore necessary to exhaust ambient air in the interior of the polishing apparatus by an exhaust system having a duct and an exhaust fan so that mist or particles in the polishing apparatus are not discharged to the clean room when the door is opened. As an exhaust condition, an exhaust speed of 0.4 m/sec or more is maintained when the door is opened.

However, since an exhaust operation of the exhaust system is fixed, i.e., is unchanged even when the door is closed, the exhaust capability (or exhaust capacity) of the exhaust system is constant. That is, the exhaust system exhausts more air than necessary. When the door is closed, if negative pressure relative to the clean room environment is developed in the polishing apparatus, this state is sufficient to prevent ambient air in the polishing apparatus from being discharged to the interior of the clean room. However, since the exhaust system is always operated at the same exhaust capability, the operating cost of the exhaust system increases.

Further, clean air supplied from the clean room to the polishing apparatus is discharged to the exterior of the plant by the exhaust system. Since clean air used in the clean room is rather expensive, if the amount of clean air discharged from the polishing apparatus is reduced, the operating cost of the whole plant can be reduced because the amount of clean air supplied to the clean room is reduced.

SUMMARY OF THE INVENTION

It is therefore an object of the present invention to provide a polishing apparatus which can exhaust a required amount of ambient air therein in accordance with an opening or closing state of a door to achieve energy saving.

According to one aspect of the present invention, there is provided a polishing apparatus for polishing a surface of a workpiece, comprising: an enclosing structure having an outer wall and at least one door; a polishing section enclosed by the enclosing structure and having a turntable with a polishing surface, and a top ring for holding a workpiece and pressing the workpiece against the polishing surface; a sensor for detecting an opening or closing of the door; an exhaust system for exhausting ambient air from an interior of the enclosing structure; and an adjusting mechanism for adjusting an amount of air which is exhausted from the interior of the enclosing structure; wherein the amount of air exhausted from the interior of the enclosing structure is reduced by the adjusting mechanism when the door is closed, and the amount of air exhausted from the interior of the enclosing structure is increased by the adjusting mechanism when the door is opened.

According to another aspect of the present invention, there is provided a method for polishing a surface of a semiconductor wafer in a polishing apparatus enclosed by an enclosing structure having an outer wall and at least one door, the method comprising: polishing a semiconductor wafer by pressing the semiconductor wafer held by a top ring against a polishing surface of a turntable; cleaning a polished semiconductor wafer and then drying a cleaned and polished semiconductor wafer; and exhausting ambient air from an interior of the enclosing structure; wherein the amount of air exhausted from the interior of the enclosing structure is reduced when the door is closed, and the amount of air exhausted from the interior of the enclosing structure is increased when the door is opened.

According to the present invention, the sensor is provided to detect an opening or closing of the door, and when the door is closed, this closing state of the door is detected by the sensor. When the door is closed, an amount of air which is exhausted from the interior of the polishing apparatus is controlled to be reduced on a basis of the signal from the sensor. That is, the amount of air exhausted from the interior of the enclosing structure, i.e. the polishing apparatus, is reduced to a certain degree enough to develop negative pressure therein. When the door is opened, this opening state of the door is detected by the sensor, and the amount of air which is exhausted from the interior of the polishing apparatus is controlled to be increased. That is, the amount of air exhausted from the interior of the polishing apparatus is increased to maintain an exhaust speed of 0.4 m/sec or more. Thus, irrespective of the opening or closing state of the door, a required amount of air can be exhausted in such respective states. In this manner, the amount of air which is exhausted from the interior of the polishing apparatus can be reduced when the door is closed, and hence the operating cost of the exhaust system can be reduced. Further, an average amount of air which is exhausted form the interior of the polishing apparatus can be reduced, thus reducing the amount of exhaust air and the amount of supply air greatly in the whole plant.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

Next, a polishing apparatus according to an embodiment of the present invention will be described below with reference to drawings.

Figure 1:
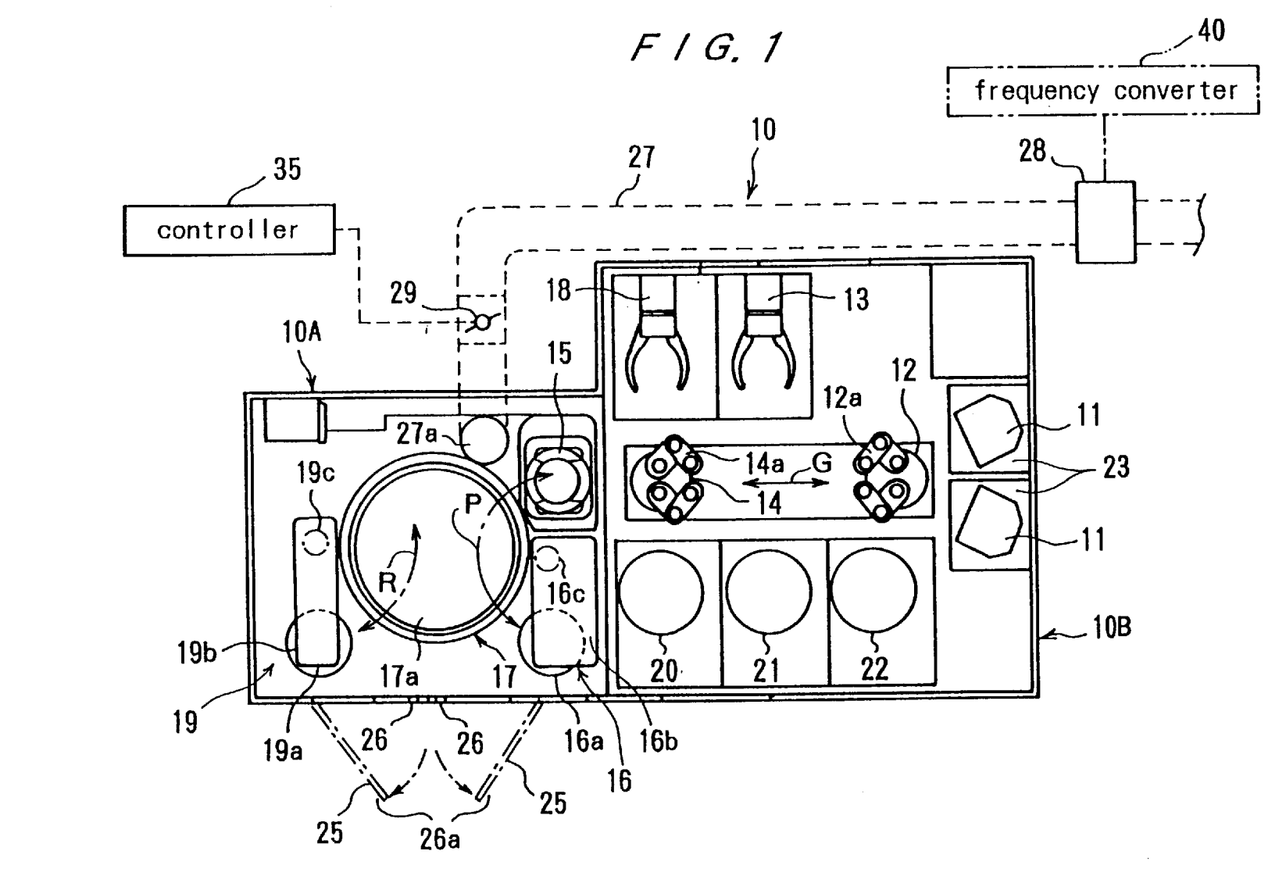
FIG. 1 is a schematic plan view of a polishing apparatus according to an embodiment of the present invention.
Figure 2:
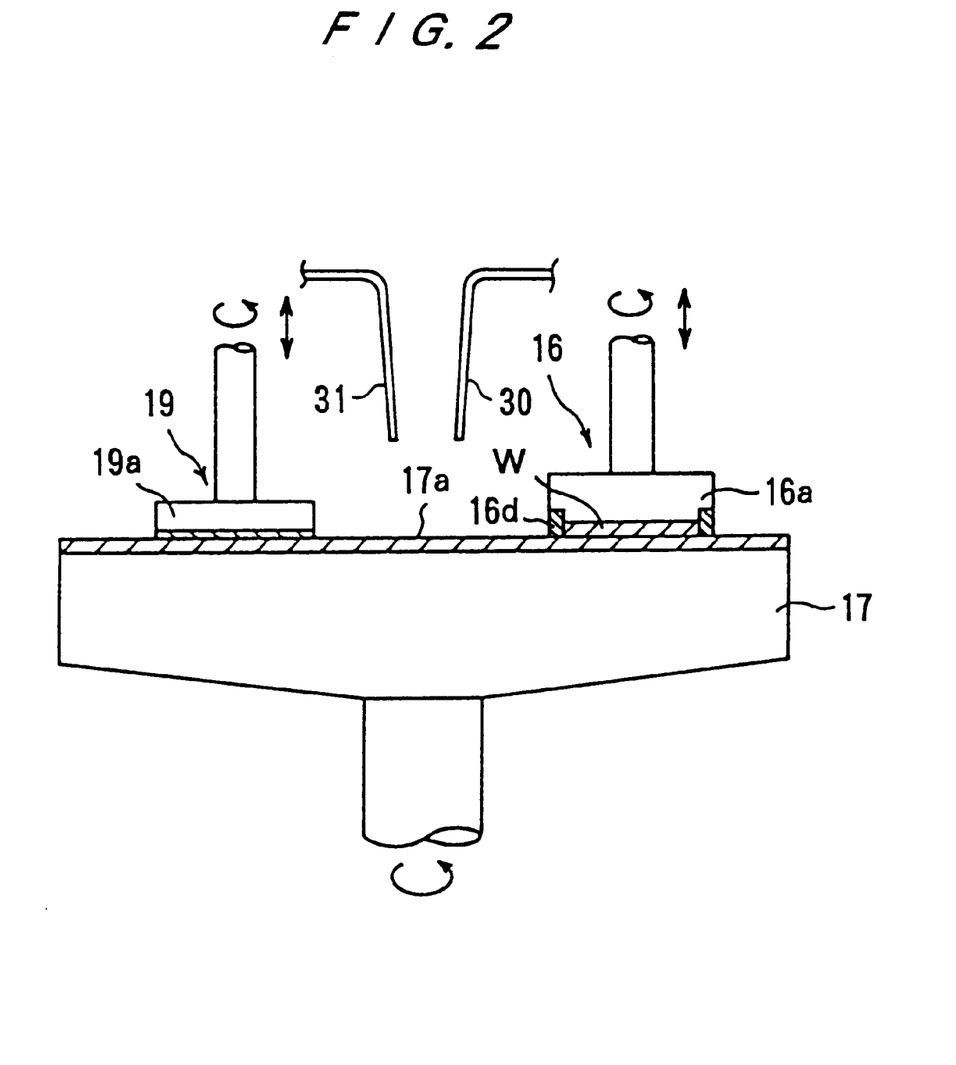
FIG. 2 is a cross-sectional view of a polishing section in the polishing apparatus.

As shown in FIG. 1 of the accompanying drawings, a polishing apparatus 10 comprises a polishing section 10A and a cleaning section 10B. As shown in FIGS. 1 and 2, the polishing section 10A comprises a central turntable 17 having a polishing surface 17a thereon, a top ring unit 16 disposed on one side of the turntable 17 and having a top ring 16a, a dressing unit 19 disposed on the other side of the turntable 17 and having a dressing tool 19a, and a workpiece transfer unit 15 positioned laterally of the top ring unit 16. The polishing surface 17a comprises a polishing cloth or a grinding stone. The turntable 17 is rotatable about its own axis as indicated by an arrow in FIG. 2 by a motor (not shown) which is coupled to the turntable 17. The top ring 16a is coupled to a motor (not shown) and also to a lifting/lowering cylinder (not shown). The top ring 16a is vertically movable and rotatable about its own axis as indicated by the arrows by the motor and the lifting/lowering cylinder. The top ring 16a can therefore press the semiconductor wafer W against the polishing surface 17a under a desired pressure. The semiconductor wafer W is attached to a lower surface of the top ring 16a under vacuum or the like. A guide ring 16d is mounted on the outer circumferential edge of the lower surface of the top ring 16a for preventing the semiconductor wafer W from being disengaged from the top ring 16a. An abrasive liquid is supplied through a supply pipe 30 onto the polishing surface 17a.

The top ring 16a supported by a top ring head 16b is swingable about a supporting shaft 16c by a swinging mechanism such as a motor so that the top ring 16a can be positioned above the turntable 17, the workpiece transfer unit 15, and a standby position shown in FIG. 1.

The dressing unit 19 comprises the dressing tool 19a which can be positioned above the turntable 17 in diametrically opposite relation to the top ring 16a. A dressing liquid is supplied through a supply pipe 31 onto the polishing surface 17a. The dressing tool 19a is coupled to a motor (not shown) and also to a lifting/lowering cylinder (not shown). The dressing tool 19a is vertically movable and rotatable about its own axis as indicated by the arrows by the motor and the lifting/lowering cylinder. The dressing tool 19a has a dressing element composed of, for example, nylon brush, or a diamond grain layer containing diamond grains on its lower surface. The dressing tool 19a supported by a dressing head 19b is swingable about a supporting shaft 19c by a swinging mechanism such as a motor so that the dressing tool 19a can be positioned above the turntable 17, and a standby position shown in FIG. 1.

The cleaning section 10B comprises two central workpiece transfer robots 12, 14 movable in the directions indicated by the arrow G, primary and secondary cleaning devices 20, 21 and a spinning drier (or a drier combined with a cleaning device) 22 which are juxtaposed on one side of the workpiece transfer robots 12, 14, and two workpiece reversing units 13, 18 which are juxtaposed on the other side of the workpiece transfer robots 12, 14.

Wafer cassettes 11 are placed on a loading and unloading unit 23. A plurality of semiconductor wafers to be polished are contained in the wafer cassette 11. The workpiece transfer robots 12, 14 have respective two hands 12a, 14a each for holding a semiconductor wafer. The semiconductor wafer to be polished is taken out from one of the wafer cassettes 11 by the hand 12a of the workpiece transfer robot 12, transferred to the polishing section 10A by the workpiece transfer robots 12, 14, and polished in the polishing section 10A. The polished semiconductor wafer is transferred to the cleaning section 10B by the workpiece transfer robots 12, 14 and cleaned by the primary and secondary cleaning devices 20 and 21, and dried by the spinning drier 22. Thereafter, the cleaned and dried semiconductor wafer W is returned to one of the wafer cassettes 11 by the wafer transfer robot 12. The semiconductor wafer W is reversed, i.e., turned upside down by the workpiece reversing units 13, 18 before and after polishing. The polishing apparatus 10 is enclosed by a box-like enclosing structure comprising a housing having outer walls. A partition wall is provided between the polishing section 10A and the cleaning section 10B, and the partition wall has an opening for allowing the semiconductor wafer W to pass therethrough.

An exhaust hole 27a is formed in a ceiling of the polishing section 10A. A duct 27 is connected to the exhaust hole 27a so that ambient air can be exhausted from the interior of the polishing apparatus to the exterior of a room such as a clean room in which the polishing apparatus 10 is installed. An exhaust fan 28 and a damper 29 are provided in the duct 27 so that the amount of air to be exhausted can be controlled. The damper 29 is controlled by a controller 35 so that the amount of air to be exhausted can be adjusted. Doors 25 are provided on the front face of the polishing section 10A, and sensors 26 are provided to detect an opening or closing of the doors 25, respectively. The sensor 26 comprises a magnetic proximity sensor having a magnet 26a provided on the door and a sensing element provided on the wall of the polishing section, and detects the opening or closing of the door by variation of flux density. Signals from the sensors 26 are input in the controller 35. A variable resistor may be provided on a shaft which is fixed to the wall of the polishing section and supports the door rotatably. In this case, the value of resistance in the variable resistor varies by the rotation of the door, and variation of the value of resistance is detected by a Wheatstone bridge, whereby the degree of opening of the doors can be detected. The sensor may comprise a contact type sensor having contacts. The degree of opening of the damper 29 is controlled by the controller 35 to adjust the amount of air to be exhausted in accordance with the opening or closing of the doors 25. To be more specific, when the doors 25 are closed, the exhaust speed in the interior of the polishing section 10A is set to 0.4 m/sec or less. When the doors 25 are opened, the exhaust speed in the interior of the polishing section 10A is set to 0.4 m/sec or more. As described above, a partition wall may be provided between the polishing section 10A and the cleaning section 10B which includes the reversing units 13, 18, the workpiece transfer robot 12, 14, the cleaning devices 20, 21, 22, and the loading and unloading unit 23. This is because the polishing section 10A is most polluted and should be isolated from the cleaning section 10B. In this case, the exhaust speed in the interior of the polishing section 10A is substantially the same as that of a polishing apparatus having no partition wall.

Figure 3:
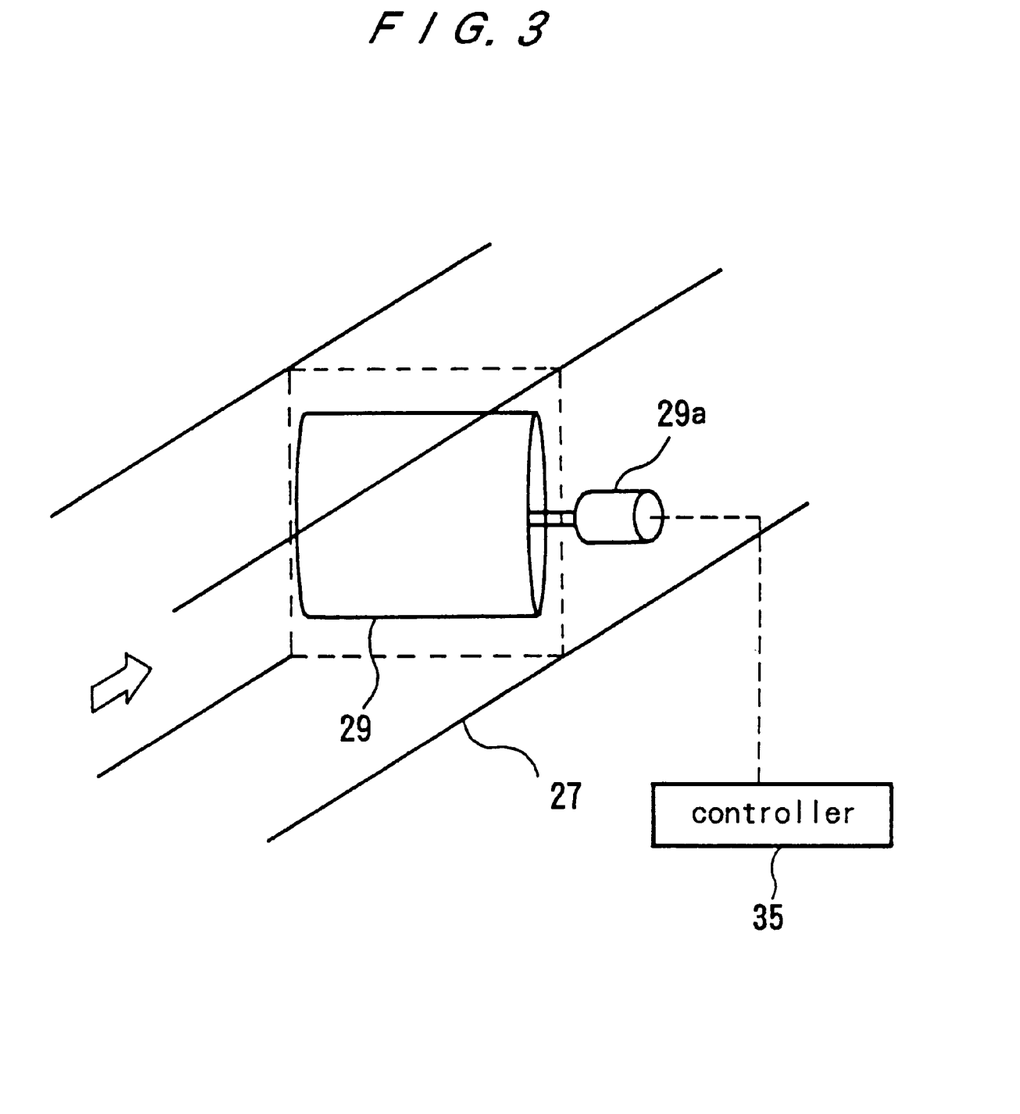
FIG. 3 is a perspective view showing the state of a damper, when a door is closed, in the polishing apparatus shown in FIG. 1.

FIG. 3 shows the state of the damper 29 when the door is closed. When the doors 25 are closed, the damper 29 is positioned so as to be perpendicular to the flow of air in the duct 27, and hence a large resistance is created against the flow of air by the damper 29 to thus reduce the amount of air which is exhausted from the interior of the polishing apparatus.

Figure 4:
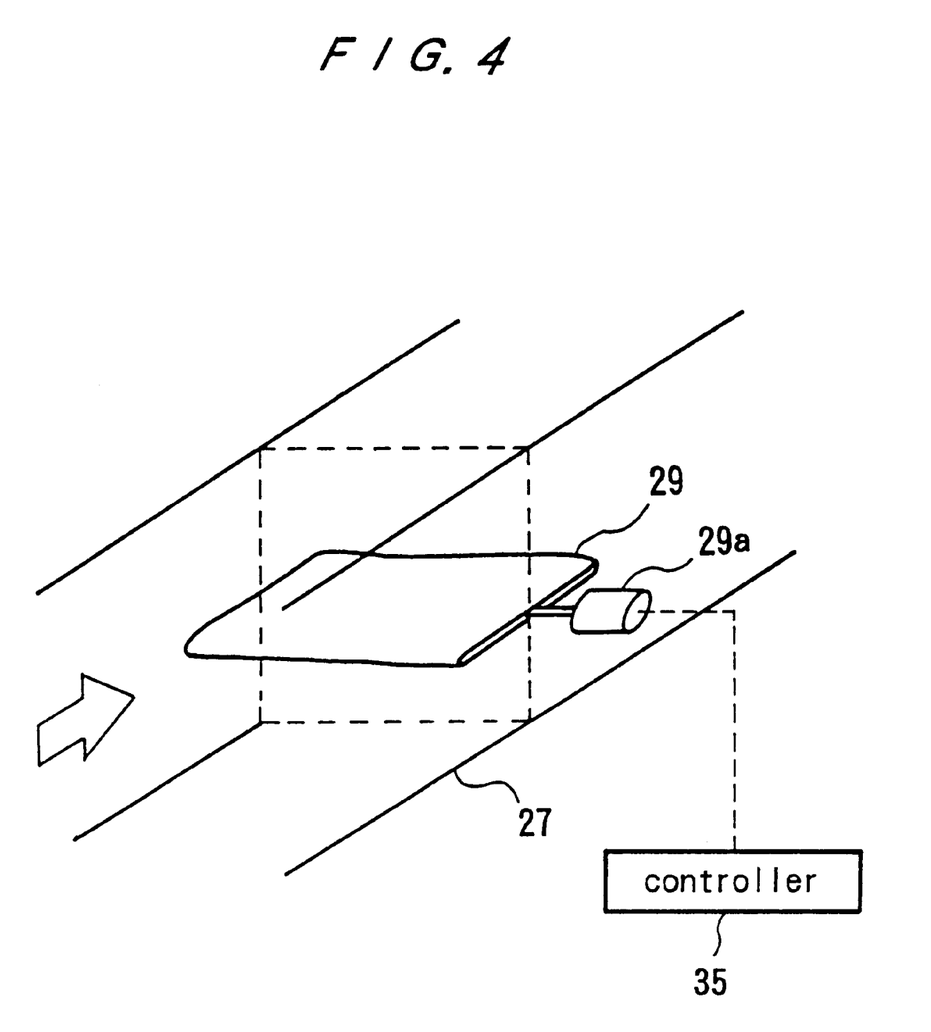
FIG. 4 is a perspective view showing the state of the damper, when the door is opened, in the polishing apparatus shown in FIG. 1.

FIG. 4 shows the state of the damper 29 when the doors are opened. When the doors 25 are opened, the damper 29 is positioned so as to cause both surfaces of the damper 29 to be parallel to the flow of air in the duct 27, and hence an area of the flow passage becomes large and the resistance against the flow of air becomes small to thus increase the amount of air which is exhausted. The opening or closing of the damper 29 is controlled by the controller 35 depending on the opening or closing state of the doors 25 which is detected by the sensors 26. The damper 29 is opened or closed by a rotary actuator 29a which is coupled to the damper 29 and controlled by a signal from the controller 35.

Next, the operation of the polishing apparatus will be described with reference to FIGS. 1 through 4.

When the workpiece cassettes 11 containing a plurality of semiconductor wafers to be polished are set in the position shown in FIG. 1, the hand 12a of the workpiece transfer robot 12 takes out a semiconductor wafer from one of the workpiece cassettes 11, and the workpiece transfer robot 12 transfers the semiconductor wafer to the workpiece reversing unit 13. The semiconductor wafer is reversed, i.e., turned upside down by the workpiece reversing unit 13. The reversed semiconductor wafer is received from the workpiece reversing unit 13 by the hand 14a of the workpiece transfer robot 14, and then transferred to the workpiece transfer unit 15 in the polishing section 10A by the workpiece transfer robot 14.

The semiconductor wafer placed on the workpiece transfer unit 15 is transferred to the top ring 16a and held under vacuum on a lower surface of the top ring 16a which is angularly moved about the shaft 16c above the turntable 17 as indicated by the dot-and-dash-line arrow P. Thereafter, the semiconductor wafer is lowered and pressed against the polishing surface 17a of the turntable 17. The semiconductor wafer is now polished while the top ring 16a and the turntable 17 are rotated. At this time, the abrasive liquid is supplied through the supply pipe 30 onto the polishing surface 17a of the turntable 17. Although a large amount of ground-off particles and mist of the abrasive liquid are generated during polishing, they are exhausted through the exhaust hole 27a formed in the ceiling of the polishing apparatus and the duct 27 by air flow created by the exhaust fan 28.

After the semiconductor wafer is polished, the top ring 16a is raised and angularly moved about the shaft 16c above the workpiece transfer unit 15, and returns the polished semiconductor wafer to the workpiece transfer unit 15. The semiconductor wafer is held by the hand 14a of the workpiece transfer robot 14, and then transferred to the workpiece reversing unit 18 by the workpiece transfer robot 14. The workpiece reversing unit 18 reverses the semiconductor wafer while the semiconductor wafer is being cleaned with a rinsing liquid such as pure water. The semiconductor wafer is received from the workpiece reversing unit 18 by the hand 14a of the workpiece transfer robot 14, and then transferred to the primary cleaning device 20. The semiconductor wafer is then cleaned by the primary and secondary cleaning devices 20, 21, and is spin-dried by the spinning drier 22. The cleaned and dried semiconductor wafer is finally returned to the wafer cassette 11 by the workpiece transfer robot 12.

After the semiconductor wafer is polished and removed from the turntable 17, the dressing tool 19a of the dressing unit 19 is angularly moved over the turntable 17 as indicated by the dot-and-dash-line arrow R, and then pressed against the polishing surface 17a of the rotating turntable 17 for thereby dressing and regenerating the polishing surface 17a.

While cleaning is carried out, although a large amount of vapor is generated from the organic solvent or acid cleaning solution, it is discharged from the interior of the polishing apparatus 10 to the exterior of the clean room through the exhaust hole 27a and the duct 27 by air flow created by the exhaust fan 28. The ambient air in the cleaning section 10B may be exhausted by exhaust ducts provided on the bottom of the cleaning section 10B, and in the respective cleaning devices 20, 21 and 22.

Although the door (or doors) 25 is opened or closed when the operational condition is observed or maintenance work is performed, since the amount of air to be exhausted is adjusted in accordance with the opening or closing of the door (or doors) 25, the exhaust speed of the air in the polishing section 10A is kept at 0.4 m/sec or more, or 0.4 m/sec or less. Therefore, a stable exhaust condition is created, and the mist of abrasive liquid and the vapor of cleaning liquid are prevented from leaking toward the exterior of the polishing apparatus. In this manner, the amount of air to be exhausted is adjusted in accordance with the opening or closing of the door (or doors), and hence the amount of air which is exhausted from the interior of the polishing apparatus is reduced when the door is closed, thus reducing the power consumed by the exhaust fan and achieving energy saving. Further, since the amount of air which is exhausted is reduced, the amount of exhaust air and the amount of supply air in the whole plant can be reduced.

In the above embodiment, although the amount of air which is exhausted from the interior of the polishing apparatus is adjusted by the opening or closing of the damper, it may be adjusted by controlling the rotational speed of the exhaust fan by using a frequency converter 40 such as an inverter as shown by imaginary lines in FIG. 1. Further, although the amount of air which is exhausted from the interior of the polishing apparatus is set to be adjusted in two states, i.e., a fully opened state or a fully closed state of the door in the above embodiment, it may be continuously adjusted in accordance with the degree of opening of the door.

Next, a polishing apparatus according to a second embodiment of the present invention will be described with reference to FIGS. 5 and 6.

Figure 5:
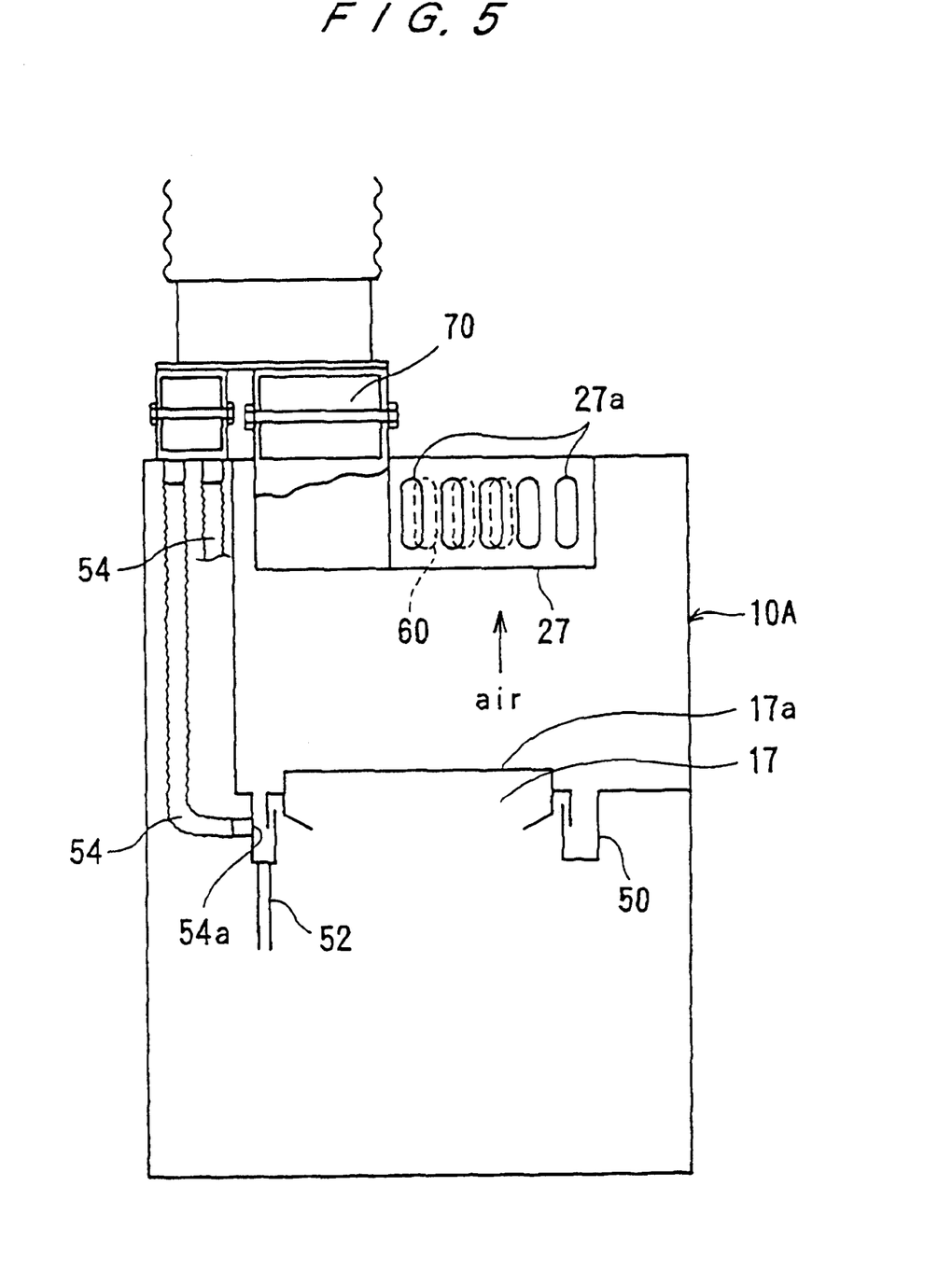
FIG. 5 is a cross-sectional view taken along line V—V of FIG. 6 and showing an essential part of the polishing section in a polishing apparatus.
Figure 6:
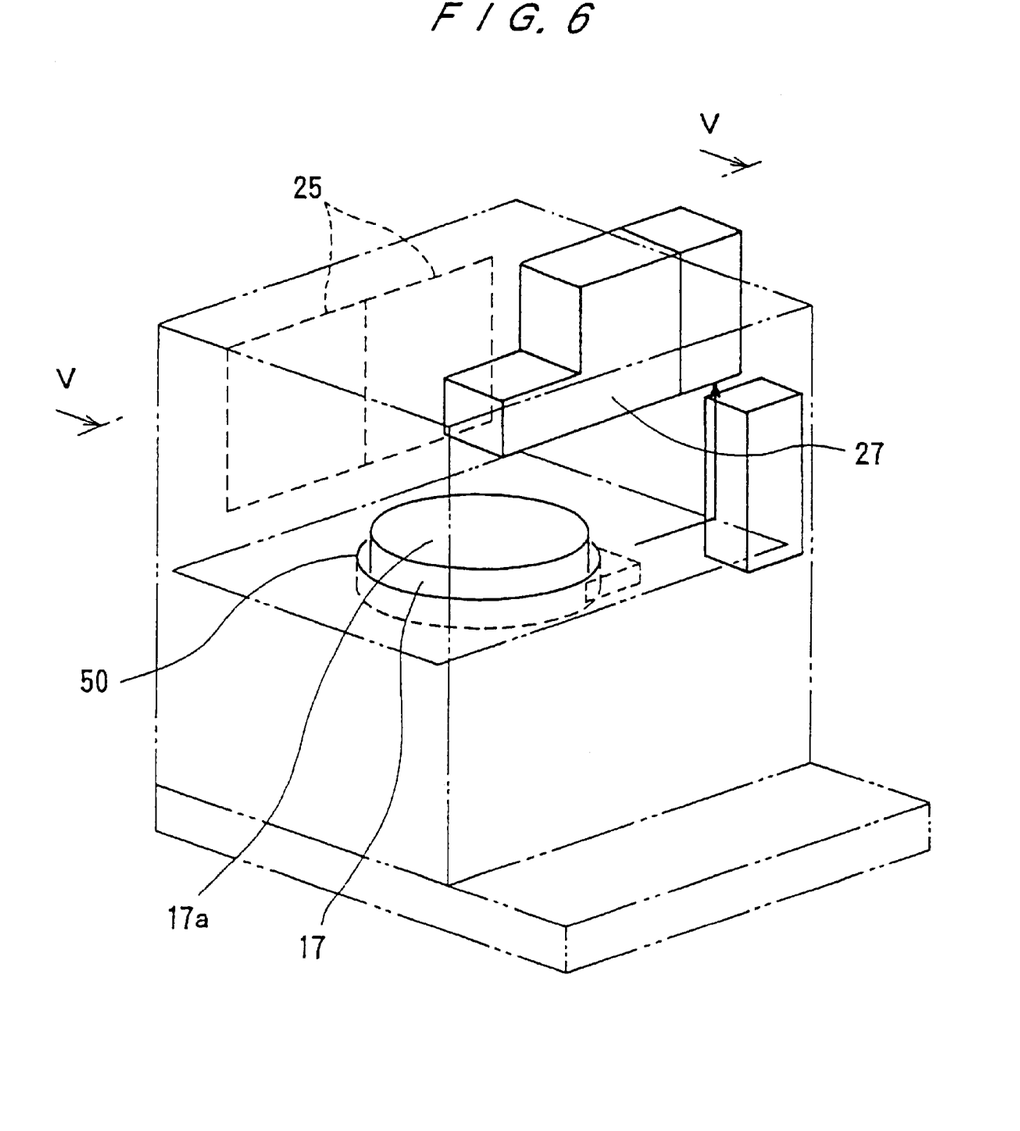
FIG. 6 is a perspective view showing the polishing section in such polishing apparatus.

FIG. 5 is a cross-sectional view taken along line V—V of FIG. 6 and showing an essential part of the polishing section in the polishing apparatus. FIG. 6 is a perspective view showing the polishing section 10A in the polishing apparatus. As shown in FIG. 5, a trough 50 is provided around the turntable 17 to receive waste liquid, including abrasive liquid, ground-off particles and dressing liquid, scattered from the turntable 17. A drain pipe 52 is provided at the bottom of the trough 50 to drain waste liquid scattered from the turntable 17. Exhaust ducts 54 are provided at the side surface of the trough 50. Exhaust openings 54a of the exhaust ducts 54 are located at a position of the polishing surface 17a of the turntable 17 or a position lower than the polishing surface 17a.

Ambient air containing mist or dust particles around the table 17 is exhausted at an exhaust speed of about 0.3 m/sec by the trough 50 and the exhaust ducts 54. By this exhausting, a down flow of air in which air in the polishing section 10A flows downwardly is created.

As shown in FIGS. 5 and 6, an exhaust duct 27 is provided on the ceiling of the polishing apparatus. The exhaust duct 27 has a plurality of openings 27a. That is, the degree of opening of the openings 27 is adjusted by a damper 60. The opening area of the openings 27a is adjusted in advance by the damper 60 so that air in the clean room flows into the polishing section 10A at a speed of 0.2 m/sec when the door (doors) 25 is in an open state.

Further, a damper 70 is provided in the exhaust duct 27. When the door (or doors) 25 is closed, the damper 70 is controlled to be closed, and exhausting is not performed by the exhaust duct 27. When the door (or doors) 25 is opened, the sensor 26 (see FIG. 1) detects the opened position of the door 25, and the damper 70 is controlled to be opened by a signal from the sensor 26. Thus, air in the polishing section 10A is exhausted by the exhaust duct 27, and air in the clean room flows into the polishing section 10A through the opening portion formed by opening the door 25 because negative pressure is developed in the polishing apparatus.

As described above, in the second embodiment, when the door 25 is closed, ambient air in the polishing apparatus is exhausted by the trough 50 and the exhaust ducts 54, and when the door 25 is opened, ambient air in the polishing apparatus is exhausted by the trough 50 and the exhaust ducts 54, and the exhaust duct 27. Thus, the amount of air exhausted from the interior of the polishing apparatus is reduced when the door is closed, and the amount of air exhausted from the interior of the polishing apparatus is increased when the door is opened.

In the embodiment shown in FIGS. 5 and 6, in the case where the degree of opening of the openings 27a of the exhaust duct 27 is controlled by the damper 60 in accordance with opening or closing of the door 25, the damper 70 in the exhaust duct 27 may be dispensed with.

As is apparent from the above description, since the amount of air which is exhausted from the interior of the polishing apparatus can be regulated depending on the opening or closing of the door, the polishing apparatus can be operated under energy-saving conditions.

Further, an average amount of air which is exhausted from the interior of the polishing apparatus can be reduced, thus reducing the amount of exhaust air and the amount of supply air greatly in the whole plant.

Although certain preferred embodiments of the present invention have been shown and described in detail, it should be understood that various changes and modifications may be made therein without departing from the scope of the appended claims.

What is claimed is:

1. A polishing apparatus for polishing a surface of a workpiece, said apparatus comprising:

an enclosing structure having an outer wall and at least one door;

a polishing section enclosed by said enclosing structure, said polishing section including a turntable with a polishing surface and a top ring for holding a workpiece and pressing the workpiece against said polishing surface;

an exhaust system for exhausting ambient atmosphere from an interior of said enclosing structure;

a sensor for detecting whether said at least one door is closed or open; and an adjusting mechanism, responsive to said detecting by said sensor, for adjusting an amount of the atmosphere exhausted from said interior such that said amount is reduced when said door is closed and said amount is increased when said door is open.

2. An apparatus as claimed in claim 1, wherein said exhaust system comprises a duct and an exhaust fan, and said adjusting mechanism comprises a damper in said duct.

3. An apparatus as claimed in claim 1, wherein said exhaust system comprises a duct and an exhaust fan, and said adjusting mechanism comprises a mechanism for controlling a rotational speed of said exhaust fan.

4. An apparatus as claimed in claim 1, wherein said adjusting mechanism is operable to control the amount of the atmosphere exhausted from said interior of said enclosing structure such that a speed of exhausting within said interior is the same both when said door is closed and when said door is open.

5. An apparatus as claimed in claim 4, wherein said adjusting mechanism is operable to maintain said exhaust speed at a level such that the atmosphere is prevented from leaking from said interior of said enclosing structure to exterior thereof.

6. An apparatus as claimed in claim 1, further comprising a cleaning section enclosed by said enclosing structure for cleaning the workpiece that has been polished by said polishing section.

7. An apparatus as claimed in claim 1, wherein said exhaust system comprises a first exhaust device that is operable both when said door is closed and when said door is open, and a second exhaust device that is operable only when said door is open.

8. An apparatus as claimed in claim 7, wherein said first exhaust device includes an exhaust opening located at a position of said polishing surface or at a position lower than said polishing surface.

9. An apparatus as claimed in claim 7, wherein said second exhaust device includes an exhaust opening located at a position higher than said polishing surface.

10. A method of polishing a surface of a workpiece in a polishing apparatus including an enclosing structure having an outer wall and at least one door, and a polishing section enclosed by said enclosing structure and including a turntable with a polishing surface and a top ring, said method comprising:

holding said workpiece and pressing said workpiece against said polishing surface by said top ring, thus polishing said surface of said workpiece;

exhausting ambient atmosphere from an interior of said enclosing structure;

detecting whether said door is closed or open; and in response to said detecting, adjusting an amount of said atmosphere exhausted from said interior such that said amount is reduced when said door is closed and said amount is increased when said door is open.

11. A method as claimed in claim 10, wherein said workpiece comprises a semiconductor wafer.

12. A method as claimed in claim 10, wherein said exhausting comprises withdrawing said atmosphere through a duct by an exhaust fan, and said adjusting comprises manipulating a damper in said duct.

13. A method as claimed in claim 10, wherein said exhausting comprises withdrawing said atmosphere through a duct by an exhaust fan, and said adjusting comprises controlling a rotational speed of said exhaust fan.

14. A method as claimed in claim 10, wherein said adjusting comprises controlling the amount of said atmosphere exhausted from said interior of said enclosing structure such that a speed of exhausting within said interior is the same both when said door is closed and when said door is open.

15. A method as claimed in claim 14, comprising maintaining said exhaust speed at a level such that said atmosphere is prevented from leaking from said interior of said enclosing structure to exterior thereof.

16. A method as claimed in claim 10, further comprising cleaning said workpiece that has been polished by said polishing section.

17. A method as claimed in claim 10, wherein said exhausting comprises operating a first exhaust device both when said door is closed and when said door is open, and operating a second exhaust device only when said door is open.

18. A method as claimed in claim 17, wherein said operating said first exhaust device includes withdrawing said atmosphere through an exhaust opening located at a position of said polishing surface or at a position lower than said polishing surface.

19. A method as claimed in claim 17, wherein said operating said second exhaust device includes withdrawing said atmosphere through an exhaust opening located at a position higher than said polishing surface.

* * * * *